(12) United States Patent
Noguchi

(10) Patent No.: US 6,365,939 B1
(45) Date of Patent: Apr. 2, 2002

(54) SEMICONDUCTOR PROTECTION DEVICE

(75) Inventor: Ko Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,843

(22) Filed: Jan. 27, 2000

(30) Foreign Application Priority Data

Jan. 25, 1999 (JP) ............................. 11-015438

(51) Int. Cl.$^7$ ............................................. H01L 23/62
(52) U.S. Cl. ...................................... 257/355; 257/362
(58) Field of Search .................................. 257/362, 355

(56) References Cited

U.S. PATENT DOCUMENTS 5,581,103 A * 12/1996 Mizukami .................... 257/355

FOREIGN PATENT DOCUMENTS

| JP | 61-280650 | 12/1986 |
| JP | 1-185972 | 7/1989 |
| JP | 2000-208712 | 7/2000 |

* cited by examiner

*Primary Examiner*—Jerome Jackson, Jr.
(74) *Attorney, Agent, or Firm*—McGinn & Gibb, PLLC

(57) ABSTRACT

The invention provides a semiconductor device that has sufficient device protection capability and besides allows integration of transistors with high density. The semiconductor device includes an NMOS transistor formed in a p-well on a p-type substrate, an n-well formed adjacent the p-well, and first and second protection elements connected to a gate electrode of the NMOS transistor. The first protection element is a pn diode formed from the p-well and an $n^+$ diffusion region provided in the p-well and lets negative charges escape to the p-type substrate. The second protection element is a pn diode formed from the n-well and a $p^+$ diffusion region provided in the n-well, and lets positive charges escape to the p-type substrate as pn junction leakage current between the n-well and the p-type substrate. In order to increase the area of the n-well that forms the protection element, the semiconductor device further includes a second p-well provided adjacent the first n-well, an n-type buried well formed below the second p-well, and a second n-well connected to the first n-well through the n-type buried well.

3 Claims, 8 Drawing Sheets

SEMICONDUCTOR PROTECTION DEVICE

BACKGROUND OF THE INVENTION

1. Field of the Invention

The present invention relates to a semiconductor device, and more particularly to a semiconductor device that includes a protection element for preventing plasma damage.

2. Description of the Related Art

When fabricating a MOS (Metal Oxide Semiconductor), various types of plasma processes are performed for a substrate such as deposition of a CVD (Chemical Vapor Deposition) film by a plasma CVD method, formation of contact holes through an interlayer insulator film by plasma etching, patterning of a wire layer by plasma etching and removal of an etching mask by plasma ashing.

During plasma processes, semiconductor wafers on which MOS transistors are formed are exposed to plasma. The plasma consists of charged particles such as ions and electrons, and these charges can move to the semiconductor substrate, and are accumulated on the MOS transistors through the exposed conductors such as wires connected to the MOS transistors. This phenomenon is called antenna effect, and a wire that gives rise to the antenna effect is called an antenna. If the amount of the accumulated charges exceeds a certain value, then the charges escape to the substrate by passing through the gate oxide film of the MOS transistor, and the gate oxide film is damaged.

Usually, damage of the type just described is called plasma damage.

The problem of plasma damage is described in the case of an NMOS transistor shown in FIG. 1, which shows a schematic sectional view of an NMOS transistor on the substrate.

The NMOS transistor is formed in a p-well 14 on a p-type substrate 12. A pair of $n^+$ diffusion regions (source/drain regions) 16A and 16B are formed in the p-well 14, and a gate electrode 20 is formed on the p-well 14 with a gate oxide film 18 interposed therebetween. Further, an interlayer insulator film 22 covers an entire area of the $n^+$ diffusion regions (source/drain regions) 16A and 16B and the gate electrode 20.

After the interlayer insulator film 22 is formed, contact holes through the interlayer insulator film 22 are formed by plasma etching. After the contact holes are formed, plasma process steps such as plasma ashing to remove the remaining photo-resist as a mask for contact hole formation, or a step of patterning a metal film deposited on the interlayer insulator film 22 by plasma etching, and so forth are performed.

During plasma processes, a large amount of charges are generated in the plasma. The charges generated in the plasma are accumulated on the gate electrode 20 by the antenna effect of the gate electrode 20 or a conductor connected to the gate electrode 20. If the accumulated charges in the gate electrode 20 exceed a predetermined amount, then they discharge into the p-type substrate 12 through the gate oxide film 18. Upon the discharge, the gate oxide film 18 is damaged.

A similar problem occurs also in the case wherein a CVD film is deposited by a plasma CVD method in order to form the interlayer insulator film 22 on the gate electrode 20.

Therefore, in order to let the charges accumulated on the gate electrode 20 escape to the p-type substrate 12 and thus to prevent the gate oxide film 18 of the NMOS transistor 10 from being damaged by the plasma processes, the NMOS transistor 10 is provided with a protection circuit that includes a protection element for discharging the accumulated charges safely.

Since the charge has a polarity of either positive or negative, the NMOS transistor 10 is provided with two kinds of protection elements that allow positive charges and negative charges to escape to the substrate. Thus the protection element includes a first protection element 24 and a second protection element 28.

The first protection element 24 is a $n^+$/p-well diode composed of the p-well 14 and an $n^+$ diffusion region 26 formed separately from the $n^+$ diffusion regions 16A and 16B in the p-well 14.

If the gate electrode 20 is charged with negative charges, then the negative charges escape to the p-type substrate 12 through the $n^+$/p-well diode 24, which provides a low resistance current path because the $n^+$/p-well diode 24 is forward biased.

The second protection element 28 is a $p^+$/n-well diode composed of an n-well 30 formed adjacent the p-well 14 and a $p^+$ diffusion region 32 formed in the n-well 30.

If the gate electrode 20 is charged with positive charges, then the positive charges escape through the second protection element 28 to the p-type substrate 12 by way of the forward biased $p^+$/n-well diode and pn junction leakage current between the n-well 30 and the p-type substrate 12.

The conventional protection element for a gate oxide film does not exhibit a sufficient protection performance against plasma damage and cannot completely prevent plasma damage by plasma processes. The inventor of the present invention has discovered that this arises from the following reasons.

The reasons are described in the case of an NMOS transistor formed on a p-type substrate described above with reference to FIG. 1. The first reason is that, although negative charges can easily escape to the p-type substrate 12 through the $n^+$/p-well diode 24, positive charges cannot completely escape to the p-type substrate 12 through the $p^+$/n-well diode 28.

By the time the device fabrication is completed, the n-well 30 should be connected to a wire for positive power supply, Vdd, through an $n^+$ diffusion region 34 in order to prevent a $p^+$/n-well diode 28 from being forward biased during normal device operation. However, during the fabrication process of the NMOS transistor 10, the n-well 30 is not electrically biased, and thus the n-well 30 is in a floating state with respect to the p-type substrate. Thus, accumulated positive charges during the plasma processes flow through the second protection element 28 by way of the forward biased $p^+$/n-well diode and pn junction leakage current between the n-well 30 and the p-type substrate 12. The forward biased $p^+$/n-well diode has a low resistance and therefore positive charges can flow easily to the n-well. However, the pn junction between the n-well 30 and the p-type substrate 12 has extremely large resistance because the junction is reverse biased and thus current conduction is done by a very low leakage current that flows as generation-recombination current, which is determined by the area of the n-well 30.

To effectively let the accumulated charges escape through the second protection element 28, it is required to make the area of the n-well 30 greater than a certain value. While it is also required to decrease the area of the n-well 30 since a MOS transistor with smaller layout area is preferable. Thus it is difficult to satisfy both of the requirements.

The second reason is that a specific guideline is not available for determining the area of the n-well 30 necessary to fully prevent plasma damage. In addition, no study for enhancing the effect of protection elements has been done.

SUMMARY OF THE INVENTION

It is an object of the present invention to provide a semiconductor device that has a sufficient device protection function, and enables a circuit layout with high density.

In order to attain the object described above, according to the present invention, there is provided a semiconductor device, comprising a semiconductor substrate of a first conductivity type, a well region of the first conductivity type formed on the semiconductor substrate, a MOS transistor of a second conductivity type formed in the well region of the first conductivity type, a well region of the second conductivity type formed adjacent the well region of the first conductivity type, and a first protection element and a second protection element connected to a gate electrode of the MOS transistor, the first protection element being a pn junction type diode formed from the well region of the first conductivity type and a diffusion region of the second conductivity type provided in the well region of the first conductivity type, while the second protection element is another pn junction type diode consisting of the well region of the second conductivity type and a diffusion region of the first conductivity type provided in the well region of the second conductivity type, an interface between the well region of the second conductivity type and the semiconductor substrate having an area equal to or greater than a value determined with reference to the size of an antenna connected to the gate electrode.

The above mentioned value is a bottom area of the interface between the well region of the second conductivity type and the semiconductor substrate through which pn junction leakage current of an amount sufficient for protection of the MOS transistor, and the value is for example 400 $\mu m^2$, or 20 $\mu m \times 20$ $\mu m$.

Preferably, the well region of the second conductivity type is formed such that a product of the bottom area of the interface between the well region of the second conductivity type and the semiconductor substrate and a pn junction leakage current density between the well region of the second conductivity type and the semiconductor substrate is equal to or greater than an amount of current that flows into the MOS transistor from the antenna during the fabrication.

Preferably, the semiconductor device further comprises a buried well region of the second conductivity type formed at least below a portion of a second well region of the first conductivity type provided separately from the well region of the first conductivity type which forms the MOS transistor, the well region of the second conductivity type being contiguous to the buried well region of the second conductivity type.

Alternatively, the semiconductor device may further comprise a second well region of the second conductivity type formed separately from the well region of the second conductivity type, and a buried well region of the second conductivity type formed below a second well region of the first conductivity type provided separately from the well region of the first conductivity type that form the first protection element, the well region of the second conductivity type being contiguous to the second well region of the second conductivity type with the buried well region of the second conductivity type interposed therebetween.

Preferably, the perimetric length L of the wire antenna connected to second protection element as represented in a unit of micrometer, the wire distance D of the wire antenna to an adjacent wire as represented in a unit of micrometer, and the area $S_1$ of the interface between the well region of the second conductivity type and the semiconductor substrate as represented in a unit of square micrometer satisfy the relationship of $$S_1 \geq L/(250D)$$

With the semiconductor device, since all of plasma current flowing into the gate electrode can escape to the semiconductor substrate of the first conductivity type through the protection circuit, the MOS transistor, particularly the gate oxide film of the MOS transistor, can be protected from otherwise possible damage. Consequently, the MOS transistor can maintain a good transistor characteristic.

Further, with the semiconductor device, the area of the well region of the second conductivity type need not be increased beyond a predetermined value. Further, if necessary, the second well region and the buried well region of the second conductivity type can be utilized as additional well regions of the second conductivity type, and the protection circuit can be formed with no added area on the substrate, since the area of the substrate above the buried well region of the second conductivity type can be used for another transistors. Consequently, integration of transistors with high density can be realized, and besides, the layout of the semiconductor device need not be changed by the addition of this protection element.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENTS

In order to develop a protection element that has sufficient protection capability and besides allows integration of transistors with high density, the inventor of the present invention conducted the following experiment.

Example of Experiment

Charges in plasma flow into a MOS transistor by an antenna effect of a conductive wire of the MOS transistor exposed to the plasma.

Based on the assumption that the amount of the plasma current must depend on the perimetric length of the wire connected to the gate electrode, in the case of plasma charge accumulation during the plasma etching of the metal wire, the relationship between the perimetric length of the wire and the amount of the plasma current was determined by an experiment.

First, an NMOS transistor having a gate electrode having specifications of the gate length L of 0.3 $\mu$m and the channel width W of 10 $\mu$m was formed on a p-type substrate, and, a metal layer with thickness of 0.5 $\mu$m was patterned by plasma etching to form a wire connected to the gate electrode.

Upon the patterning, the wire layer was etched to form an isolated wire, and the relationship between the perimetric length of the wire connected to the gate electrode and the amount of the plasma current that was supposed to flow through the gate oxide was measured.

The amount of the current that flows from the plasma to the MOS transistor depends also upon the configuration of the wire as an antenna. When the wire is charged by a phenomenon called electron-shading effect, the amount of charge increases as the distance of the wire to an adjacent wire decreases. Therefore, in the experiment, two sets of wires (antenna portions) were formed such that they had the width of 0.3 $\mu$m and were individually spaced from each other by two different distances of 0.3 $\mu$m and 0.5 $\mu$m, and the relationship between the wire perimetric length and the amount of the current by plasma process was determined for each of the two wire sets. The distance of 0.3 $\mu$m is an example of a comparatively small wire distance, and the distance of 0.5 $\mu$m is an example of a comparatively large wire distance.

In the plasma etching of the wire layer, a photo resist film with thickness of 1 $\mu$m was used as an etching mask while BCl$_3$ (boron trichloride) and Cl$_2$ (chlorine gas) were used as etching gas, and high density plasma etcher was used.

The amount of the plasma current was determined by comparing the shift of a transistor characteristic by plasma etching with the shift of a transistor characteristic obtained by applying an electrical stress.

Figure 6:
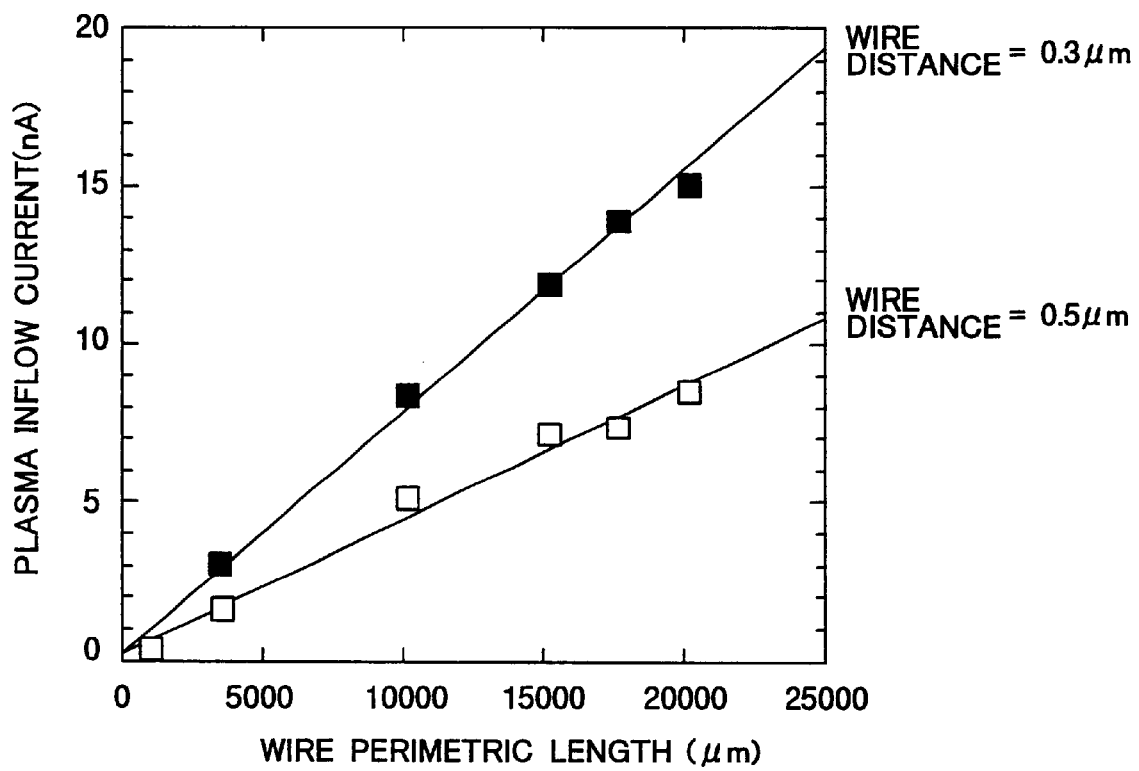
FIG. 6 is a graph illustrating a relationship between the wire perimetric length and the amount of plasma current.

From the experiment, it was found that the amount of the current (nA) from the plasma increases substantially in proportion to the wire perimetric length ($\mu$m) as seen from FIG. 6. It is to be noted that, in the present specification, the wire perimetric length or the antenna perimetric length is defined as a sum of the perimetric length of a wire, which is calculated as follows:

wire perimetric length (antenna perimetric length)=wire length×2+ wire width×2

In a protection element intended for positive charges, which is composed of a p$^+$/n-well diode and a p-type substrate, since an n-well is in a floating state with respect to the p-type substrate, the amount of current to flow through the p$^+$/n-well diode is determined and limited by the amount of reverse leakage current between the n-well and the p-type substrate. This reverse leakage current between the n-well and the p-type substrate increases in proportion to the area ($\mu$m$^2$) of the n-well as seen from FIG. 7.

In order to protect a MOS transistor from being damaged, the plasma current should all escape to the p-type substrate through the protection element.

Figure 7:
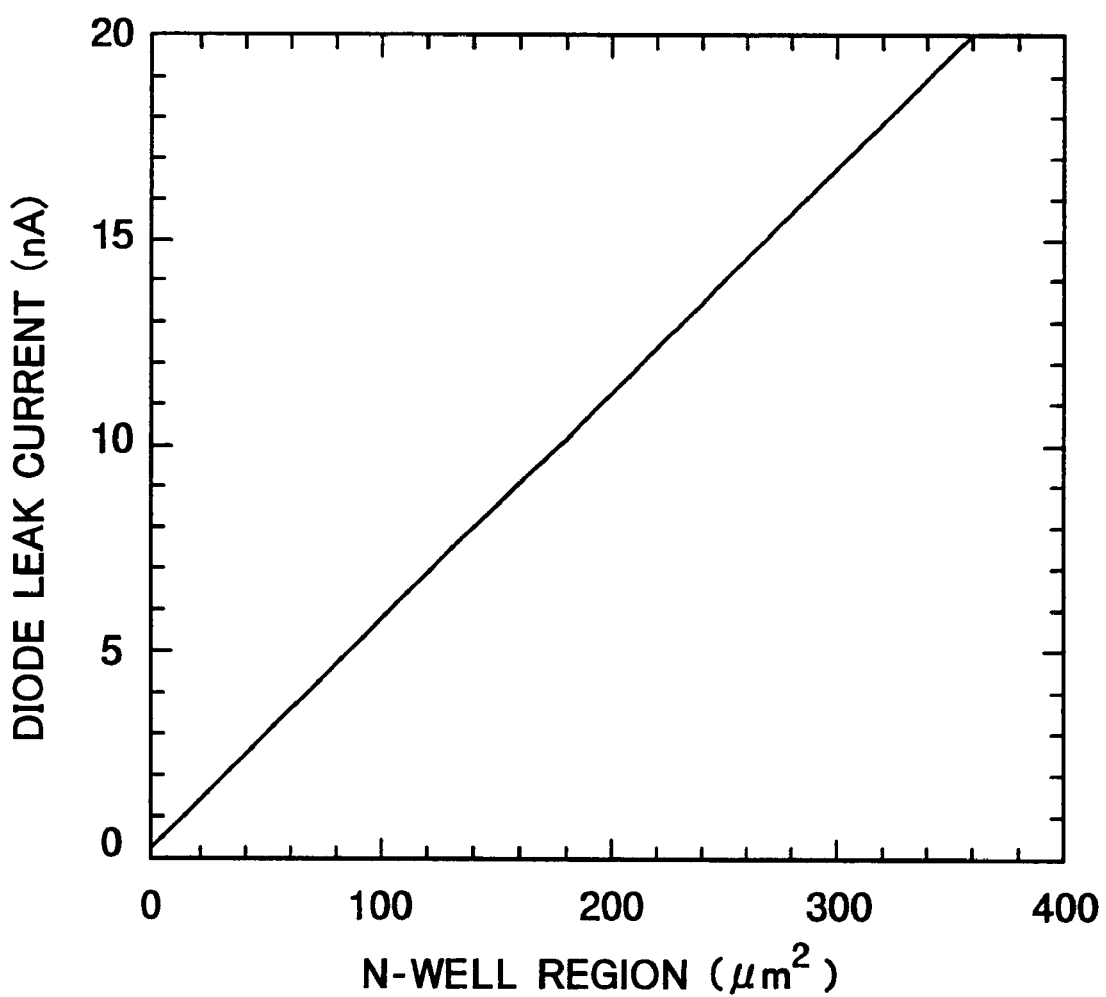
FIG. 7 is a graph illustrating a relationship between the amount of pn junction leakage current and the area of an n-well.

To this end, the amount of the current from the plasma is determined from the wire perimetric length based on the graph of FIG. 6, and the area of the n-well necessary for the plasma current to flow is determined from the graph of FIG. 7. Then, a protection element that can prevent plasma damage can be formed by forming an n-well having the area thus determined.

The above mentioned can be represented as the following expression:

n-well area ($\mu$m$^2$)≧wire perimetric length ($\mu$m)/K    (1)

where K is a value that can be determined from the gradient of one of the straight lines of FIG. 6, and the gradient of the straight line of FIG. 7 and thus K=75 when the wire distance is 0.3 $\mu$m, and K=125 when the wire distance is 0.5 $\mu$m. The value of K increases in proportion to the wire distance D, and if the wire distance is represented in a unit of micrometer, then K=250×D.

The gradient of any straight line of FIG. 6 is a function of the wire distance and the plasma state, and the gradient of the straight line of FIG. 7 indicates the intensity of the pn junction leakage current and is a function of the temperature of the substrate and the intensity of plasma light during plasma processing. When the wire pattern includes wires having various distances, a representative value of the wire distances should be used as an applied wire distance.

From the relationship between the expression (1) given above and K=250D, if the n-well is formed such that the wire perimetric length L of the wire antenna connected to the p$^+$/n-well diode as represented in a unit of micrometer, the wire to an adjacent wire D of the wire antenna as represented in a unit of micrometer and the area S$_1$ of the interface between the n-well and the semiconductor substrate as represented in a unit of square micrometer may satisfy the relationship of S$_1$≧L/(250D) then plasma damage can be prevented.

The expression (1) above can be defined using the antenna ratio as n-well area ($\mu$m$^2$)≧(gate oxide film area/wire film thickness)× (antenna ratio/K)    (2)

where the antenna ratio is given by antenna ratio=(wire perimetric length×wire film thickness)/area of gate oxide film    (3)

Now, preferred embodiments of the present invention are described in detail below.

Embodiment 1

Figure 1:
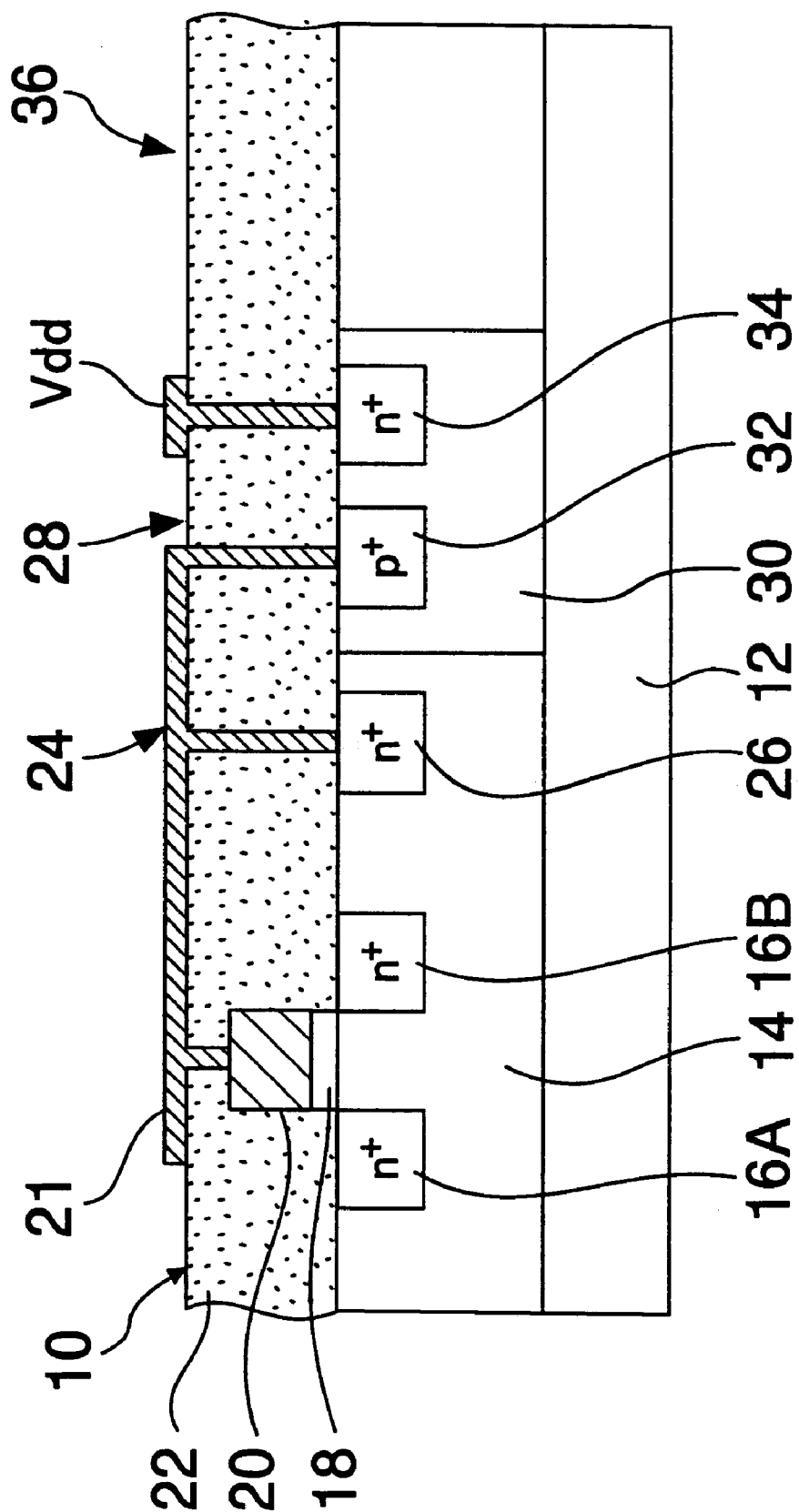
FIG. 1 is a schematic cross sectional view showing a structure of an NMOS transistor and a protection circuit of a semiconductor device to which the present invention is applied.

Referring to FIG. 1, there is shown a semiconductor device to which the present invention is applied. The semiconductor device 36 includes an NMOS transistor and a protection circuit for protecting the NMOS transistor from plasma damage. The semiconductor device 36 has a similar construction to but is different from the conventional semiconductor device described hereinabove with reference to FIG. 1 in that the area of an n-well provided adjacent the NMOS transistor is equal to or greater than a predetermined value determined with reference to the size of a wire antenna connected to the gate electrode.

More particularly, the semiconductor device 36 of the present embodiment includes an NMOS transistor 10 formed in a p-well 14 on a p-type substrate 12, an n-well 30 formed adjacent the p-well 14, and a first protection element 24 and a second protection element 28 connected to a gate electrode 20 of the NMOS transistor 10 and a wire antenna 21 connected to the gate electrode 20.

The first protection element 24 is a pn diode formed from the p-well 14 and an n+ diffusion region 26 provided in the p-well 14 and lets negative charges escape to the p-type substrate 12.

The second protection element 28 is a pn diode formed from the n-well 30 and a p+ diffusion region 32 in the n-well 30, and lets positive charges escape as pn junction leakage current between the n-well 30 and the p-type substrate 12 to the p-type substrate 12.

The wire perimetric length L of the wire antenna 21 connecting to the second protection element 28, the wire distance D of the wire antennas to an adjacent wire and the area $S_1$ of the interface between the n-well 30 and the p-type substrate 12 satisfy the relationship of $S_1 \geq L/(250D)$.

In the semiconductor device 36 of the present embodiment having the construction described above, all of plasma current flowing into the gate electrode 20 from the wire antenna 21 can escape to the p-type substrate 12 through the first protection element 24 or the second protection element 28.

Embodiment 2

Figure 2:
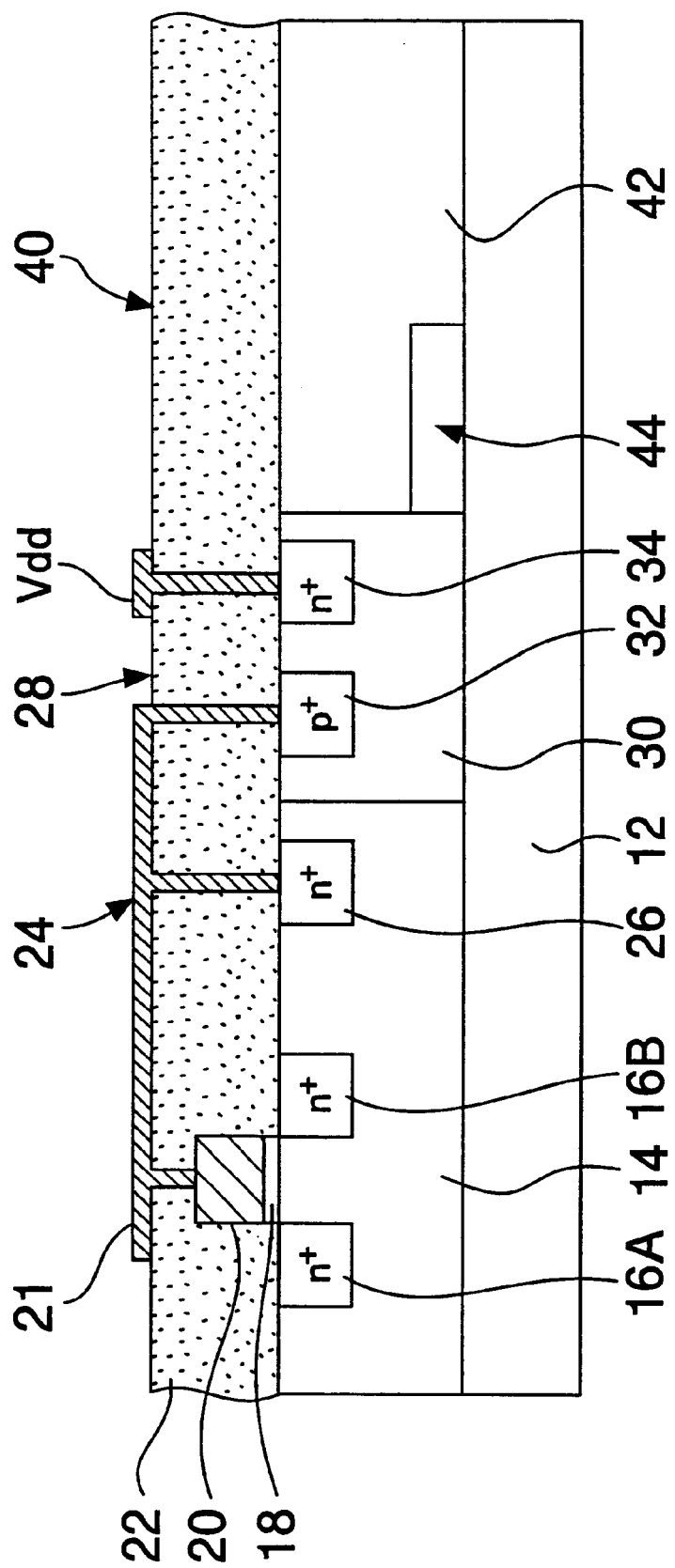
FIG. 2 is a similar view but showing a structure of another semiconductor device to which the present invention is applied.

Referring now to FIG. 2, there is shown another semiconductor device to which the present invention is applied. The semiconductor device is denoted as 40 and is a modification to but is different from the semiconductor device 36 of the Embodiment 1 described hereinabove with reference to FIG. 1 in that it additionally includes an n-type buried well (deep n-well) 44 formed below a p-well 42 provided adjacent the n-well 30.

In the semiconductor device 40 of the present embodiment, the area of the n-well which forms a protection element is given as a sum of the area of the original n-well 30 and the area of the n-type buried well 44. Therefore, the area of the n-well that forms the protection element can be increased while the area of the n-well 30 is kept small. Further, since the n-type buried well 44 is formed below the p-well 42, it does not have an influence on the circuit layout.

In the semiconductor device 40 of the present embodiment having the construction described above, all of plasma current flowing into the gate electrode 20 from the wire antenna 21 can escape to the p-type substrate 12 through the first protection element 24 or the second protection element 28.

Embodiment 3

Figure 3A:
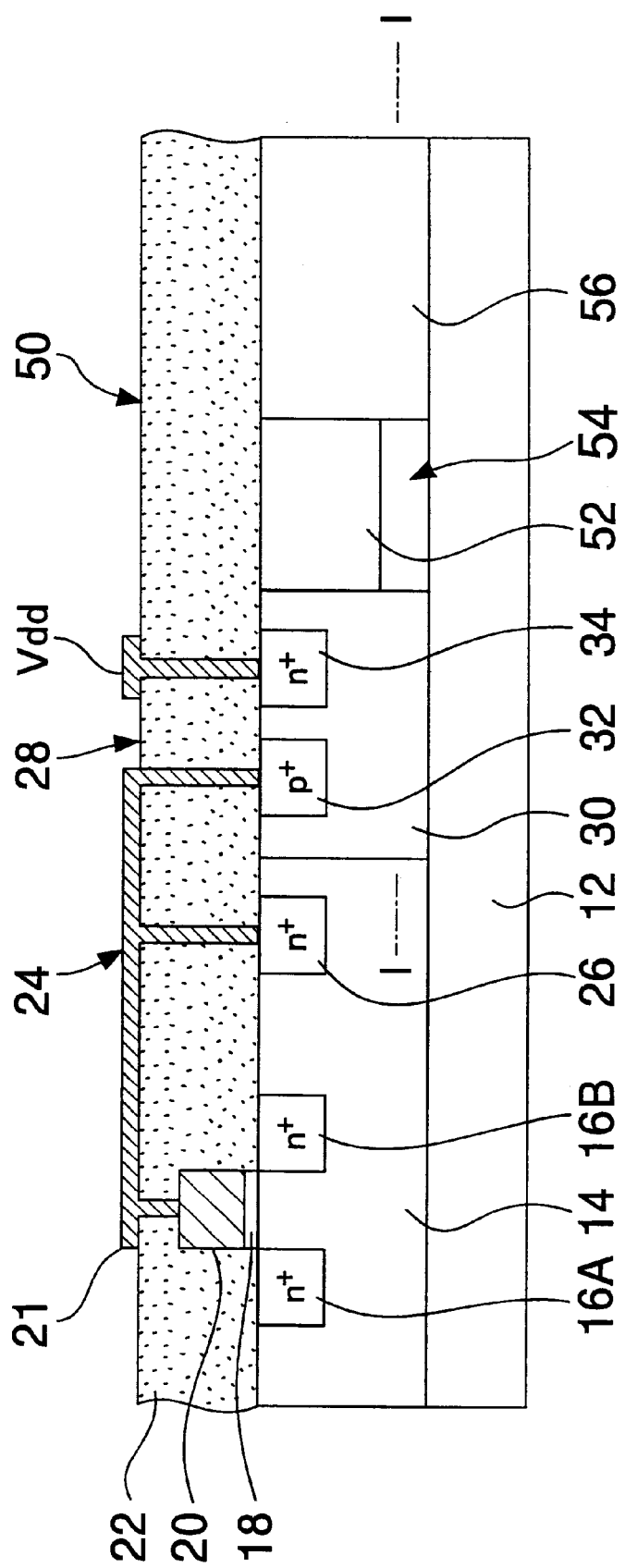
FIG. 3(a) is a similar view but showing a structure of a further semiconductor device to which the present invention is applied.
Figure 3B:
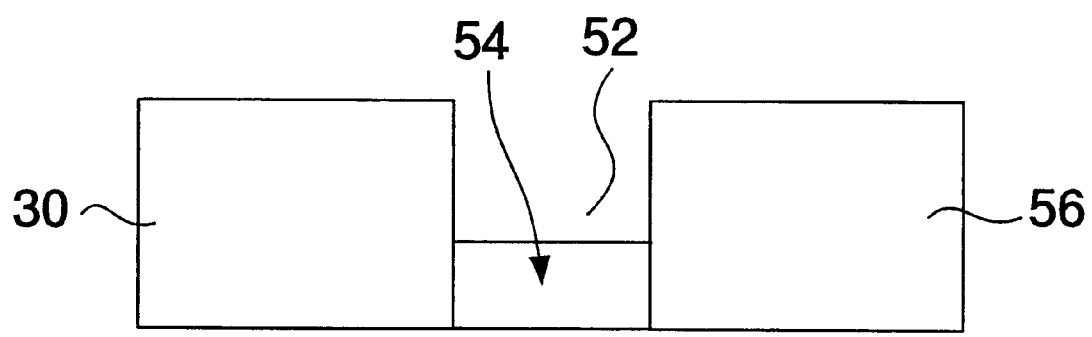
FIG. 3(b) is a schematic sectional view taken along line I—I of FIG. 3(a) and showing an arrangement of wells.

Referring now to FIGS. 3(a) and 3(b), there is shown another semiconductor device to which the present invention is applied. The semiconductor device is denoted as 50, and is another modification to but is different from the semiconductor device 36 of the Embodiment 1 described hereinabove with reference to FIG. 1 in that it additionally includes, in order to increase the area of the n-well which forms a protection element against plasma damage, a second p-well 52 provided adjacent the n-well 30, an n-type buried well (deep n-well) 54 formed below the second p-well 52, and a second n-well 56 connected to the n-well 30 through the n-type buried well 54.

In the semiconductor device 50 of the present embodiment, the area of the n-well which forms the protection element is given as a sum of the area of the original first n-well 30, the area of the n-type buried well 54 and the area of the second n-well 56. Therefore, it is easy to make the area S of the interface between the n-well and the p-type substrate 12 equal to or greater than a predetermined value. Further, since any n-well for formation of a PMOS transistor can be used as the second n-well 56, the influence upon the circuit layout is little upon formation of the protection circuit.

In the semiconductor device 50 of the present embodiment having the construction described above, plasma current flowing into the gate electrode 20 from the wire antenna 21 can escape to the p-type substrate 12 through the first protection element 24 or the second protection element 28.

FIGS. 4(a) to 4(d) illustrate a process of fabrication of the semiconductor device 50 of the Embodiment 3 described above.

Figure 4A:
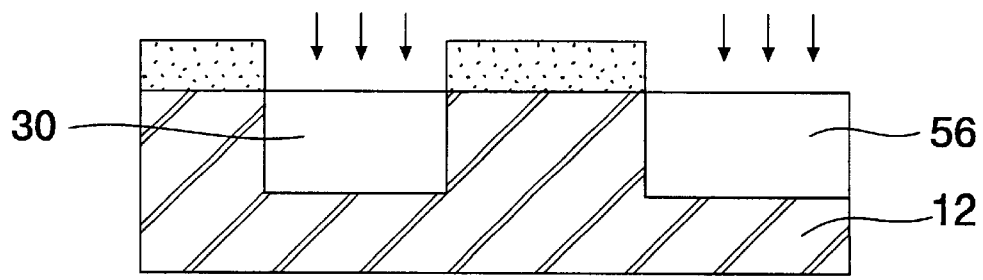
FIGS. 4(a) to 4(d) are schematic cross sectional views of a substrate illustrating different steps of a process for fabrication of the semiconductor device of FIG. 3(a)

In the process of fabrication of the semiconductor device 50, a mask which has an opening on the region where the n-well is to be formed is formed, and a first n-well 30 and a second n-well 56 are formed on a p-type substrate 12 by ion implantation of an n-type impurity as shown in FIG. 4(a). The ion implantation can consist of multiple steps with different implantation energies and dosages.

As an example, as the first stage of ion implantation of an n-type impurity, phosphorus (P) ions are implanted into the p-type substrate 12 with the implantation energy of 700 keV and the dosage of $2 \times 10^{13}/cm^2$.

Then, as the second stage of ion implantation of an n-type impurity, phosphorus (P) ions are implanted with the implantation energy of 200 keV and the dosage of $4 \times 10^{12}/cm^2$ to form a first n-well 30 and a second n-well 56 on the p-type substrate 12.

Figure 4B:
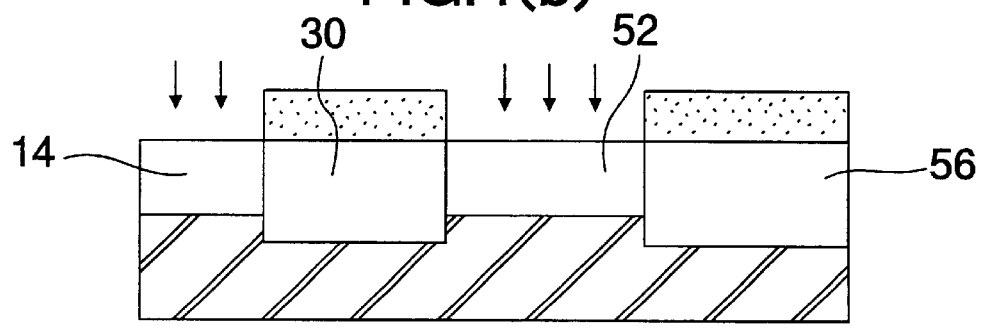

Then, a mask which has an opening on the region where p-wells are to be formed is formed, and a first p-well 14 and a second p-well 52 are formed on the p-type substrate 12 by ion implantation of a p-type impurity as shown in FIG. 4(b). The ion implantation can consist of multiple steps with different implantation energies and dosages.

As an example, as the first stage of ion implantation of a p-type impurity, boron (B) ions are implanted into the p-type substrate 12 with the implantation energy of 250 keV and the dosage of $2 \times 10^{13}/cm^2$.

Then, as the second stage of ion implantation of a p-type impurity, boron (B) ions are implanted with the implantation energy of 100 keV and the dosage of $3 \times 10^{12}/cm^2$ to form a first p-well 14 and a second p-well 52 on the p-type substrate 12.

Figure 4C:
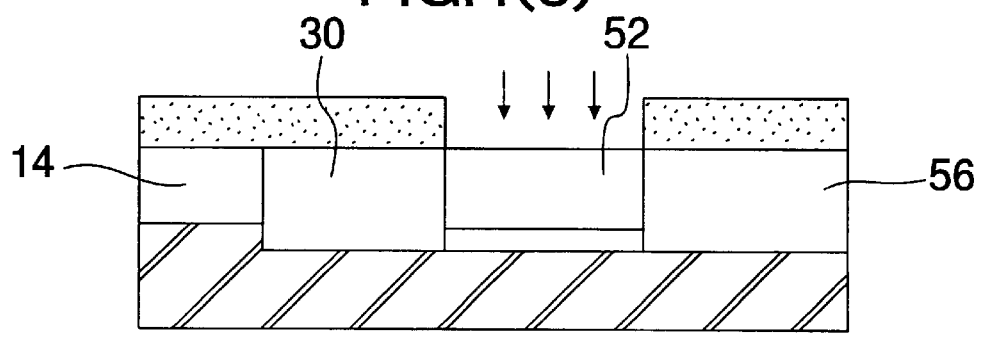
Figure 4D:
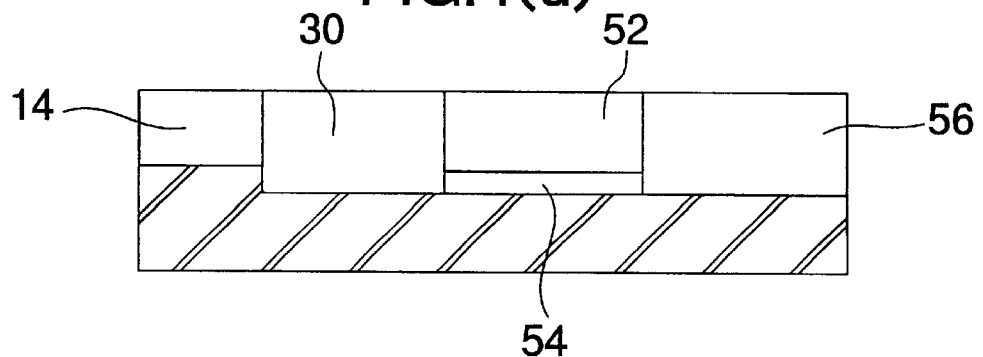

Then, a mask which has an opening on the region where p-well 52 is to be formed is formed as shown in FIG. 4(c), and ions of an n-type impurity are implanted. As an example, phosphorus (P) ions as the n-type impurity are implanted into a portion of the p-type substrate 12 below the second p-well 52 with the implantation energy of 900 keV and the dosage of $5 \times 10^{12}/cm^2$ to form an n-type buried well (deep n-well) 54 below the second p-well 52 as shown in FIG. 4(d).

After all of the ion implantation steps are completed, heat treatment is performed at the temperature of 900° C. for 30 minutes in a nitrogen atmosphere to activate the ion-implanted impurities, and then, a MOS transistor and first and second protection elements are formed in an ordinary procedure. As a result, the structure shown in FIG. 3(a) is obtained.

It is to be noted that the ion implantation of an n-type impurity in the step of FIG. 4(c) may be performed only for a portion of the p-type substrate 12 below the second p-well 52 that is adjacent the n-well 30. In this instance, the structure shown in FIG. 2 is obtained.

FIGS. 5(a) to 5(d) illustrate another process of fabrication of the semiconductor device 50 of the present embodiment.

Figure 5A:
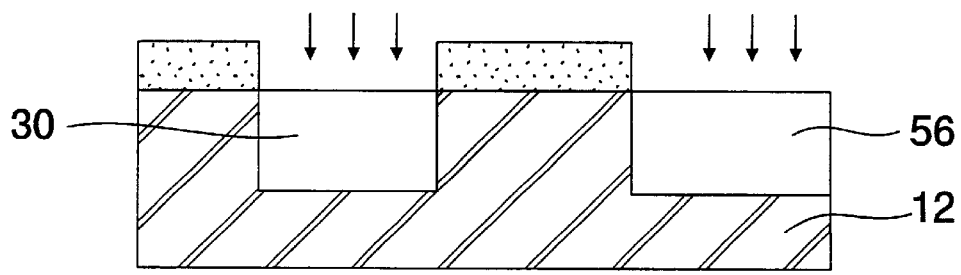
FIGS. 5(a) to 5(d) are similar views of a substrate illustrating different steps of another process for fabrication of the semiconductor device of FIG. 3(a)

In the present process of fabrication of the semiconductor device 50, a mask which has an opening on the region where n-wells are to be formed is formed, and a first n-well 30 and a second n-well 56 are formed on a p-type substrate 12 by ion implantation of phosphorus (P) ions as an n-type impurity with the implantation energy of 200 keV and the dosage of $4 \times 10^{12}/cm^2$ as shown in FIG. 5(a).

Figure 5B:
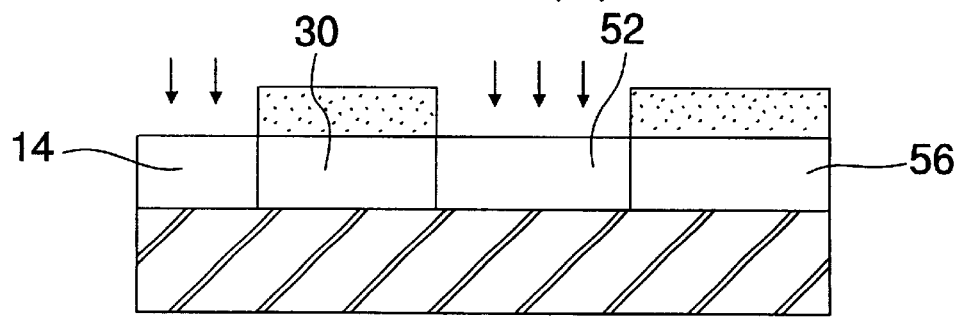

Then, a mask which has an opening on the region where p-wells are to be formed is formed, and a first p-well 14 and a second p-well 52 are formed on the p-type substrate 12 by two stages of ion implantation of a p-type impurity as shown in FIG. 5(b). In this step, as the first stage of ion implantation of a p-type impurity, boron (B) ions are implanted with the implantation energy of 250 keV and the dosage of $2 \times 10^{13}/cm^2$.

Then, as the second stage of ion implantation of a p-type impurity, boron (B) ions are implanted with the implantation energy of 100 keV and the dosage of $3 \times 10^{12}/cm^2$ to form a first p-well 14 and a second p-well 52.

Figure 5C:
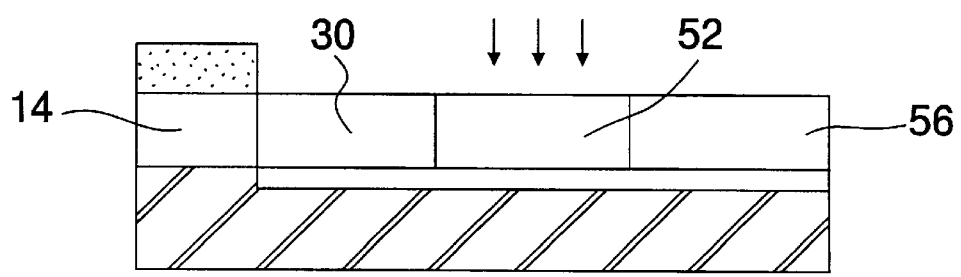
Figure 5D:
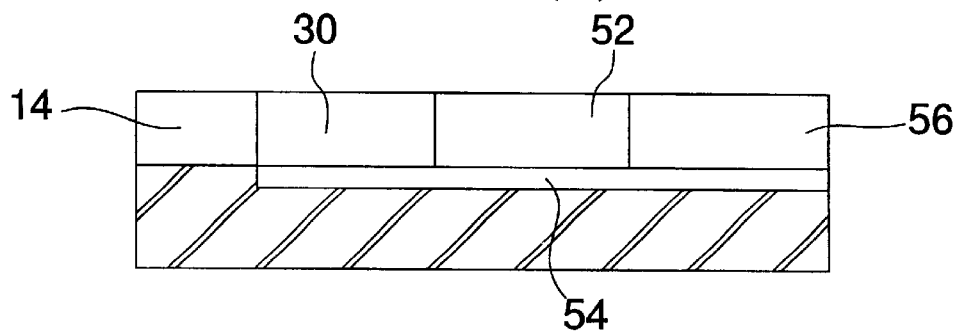

Then, a mask which covers over the other areas than the p-well 14 is formed as shown in FIG. 5(c), and phosphorus (P) ions as an n-type impurity are implanted into a portion of the p-type substrate 12 below the first n-well 30, second p-well 52 and second n-well 56 with the implantation energy of 900 keV and the dosage of $2 \times 10^{13}/cm^2$ to form an n-type buried well (deep n-well) 54 below the first n-well 30, second p-well 52 and second n-well 56 as shown in FIG. 5(d).

After all of the ion implantation steps are completed, heat treatment is performed at the temperature of 900° C. for 30 minutes in a nitrogen atmosphere to activate the ion-implanted impurities, and then, a MOS transistor and first and second protection elements are formed in an ordinary procedure.

While, in the embodiments described above, a protection element for an NMOS transistor formed on a p-type substrate is described, the present invention is not limited to this, but can be applied also to a protection element for a p-type transistor formed on an n-type substrate. In this case, ions of opposite conductivity types to those of the elements described above should be used.

While preferred embodiments of the present invention have been described using specific terms, such description is for illustrative purposes only, and it is to be understood that changes and variations may be made without departing from the spirit or scope of the following claims.

What is claimed is:

1. A semiconductor device, comprising:
a semiconductor substrate of a first conductivity type;
a well region of the first conductivity type formed on said semiconductor substrate;
a MOS transistor of a second conductivity type formed in said well region of the first conductivity type;
a well region of the second conductivity type formed adjacent said well region of the first conductivity type; and
a first protection element and a second protection element connected to a gate electrode of said MOS transistor, said first protection element comprising a pn junction type diode formed from said well region of the first conductivity type and a diffusion region of the second conductivity type provided in said well region of the first conductivity type, while said second protection element comprises another pn junction type diode formed from said well region of the second conductivity type and a diffusion region of the first conductivity type provided in said well region of the second conductivity type; and
an interface between said well region of the second conductivity type and said semiconductor substrate,
wherein the perimetric length L of said wire antenna connected to said second protection element as represented in a unit of micrometer, the wire distance D of said wire to an adjacent wire as represented in a unit of micrometer and the area $S_1$ of said interface between said well region of the second conductivity type and said semiconductor substrate as represented in a unit of square micrometer satisfy the relationship of $S_1 \geq L/(250D)$.

2. A semiconductor device, comprising:
a semiconductor substrate of a first conductivity type;
a well region of the first conductivity type formed on said semiconductor substrate;
a MOS transistor of a second conductivity type formed in said well region of the first conductivity type;
a well region of the second conductivity type formed adjacent said well region of the first conductivity type; and
a first protection element and a second protection element connected to a gate electrode of said MOS transistor, said first protection element comprising a pn junction type diode formed from said well region of the first conductivity type and a diffusion region of the second conductivity type provided in said well region of the first conductivity type, while said second protection element comprises another pn junction type diode formed from said well region of the second conductivity type and a diffusion region of the first conductivity type provided in said well region of the second conductivity type;
an interface between said well region of the second conductivity type and said semiconductor substrate; and
a buried well region of the second conductivity type formed at least below a portion of a second well region of the first conductivity type provided separately from said well region of the first conductivity type which forms said MOS transistor, said well region of the second conductivity type being contiguous to said buried well region of the second conductivity type,
wherein the perimetric length L of said wire antenna connected to said second protection element as represented in a unit of micrometer, the wire distance D of said wire antenna to an adjacent wire as represented in a unit of micrometer, the area $S_1$ of said interface between said well region of the second conductivity type and said semiconductor substrate as represented in a unit of square micrometer and the area $S_2$ of an interface between said buried well region of the second conductivity type and said semiconductor substrate as represented in a unit of square micrometer satisfy the relationship of $S_1 + S_2 \geq L/(250D)$.

3. A semiconductor device, comprising:

a semiconductor substrate of a first conductivity type;

a well region of the first conductivity type formed on said semiconductor substrate;

a MOS transistor of a second conductivity type formed in said well region of the first conductivity type;

a well region of the second conductivity type formed adjacent said well region of the first conductivity type;

a first protection element and a second protection element connected to a gate electrode of said MOS transistor; said first protection element comprising a pn junction type diode formed from said well region of the first conductivity type and a diffusion region of the second conductivity type provided in said well region of the first conductivity type, while said second protection element comprises another pn junction type diode formed from said well region of the second conductivity type and a diffusion region of the first conductivity type provided in said well region of the second conductivity type; and an interface between said well region of the second conductivity type and said semiconductor substrate; and a second well region of the second conductivity type formed separately from said well region of the second conductivity type, and a buried well region of the second conductivity type formed below a second well region of the first conductivity type provided separately from said well region of the first conductivity type which formed said first protection element, said well region of the second conductivity type being contiguous to said second well region of the second conductivity type with said buried well region of the second conductivity type interposed therebetween, wherein the perimetric length L of said wire antenna connected to said second protection element as represented in a unit of micrometer, the protection element as represented in a unit of micrometer, the wire distance D of said wire antenna to an adjacent wire as represented in a unit of micrometer, the area $S_1$ of said interface between said well region of the second conductivity type and said semiconductor substrate as represented in a unit of square micrometer, the area $S_2$ of an interface between said buried well region of the second conductivity type and said semiconductor substrate as represented in a unit of square micrometer and the area $S_3$ of an interface between said second well region of the second conductivity type and said semiconductor substrate as represented in a unit of square micrometer satisfy the relationship of $S_1+S_2+S_3 \geq L/(250D)$.

* * * * *